United States Patent
Ferianz

(10) Patent No.: US 6,920,336 B2
(45) Date of Patent: Jul. 19, 2005

(54) BROADBAND DRIVER

(75) Inventor: Thomas Ferianz, Glanegg (AT)

(73) Assignee: Infineon Technologies AG, München (DE)

( * ) Notice: Subject to any disclaimer, the term of this patent is extended or adjusted under 35 U.S.C. 154(b) by 577 days.

(21) Appl. No.: 09/971,803

(22) Filed: Oct. 3, 2001

(65) Prior Publication Data

US 2002/0098863 A1 Jul. 25, 2002

(30) Foreign Application Priority Data

Oct. 5, 2000 (DE) .......................................... 100 49 331

(51) Int. Cl.[7] .............................. H04M 1/00; H03F 3/45
(52) U.S. Cl. ...................... 455/552.1; 330/69; 330/104; 330/124 R
(58) Field of Search .......................... 455/426.1, 14–15, 455/550.1, 552.1, 553.1, 424–425; 330/69, 104, 124 R, 260, 295; 379/92.04, 93.01, 93.05, 93.06, 380, 386, 391, 394, 395, 399.01, 399.02, 402, 403, 413.02, 413.04, 414, 415; 370/493, 494, 495, 496, 497, 480, 488

(56) References Cited

U.S. PATENT DOCUMENTS

| 5,623,543 | A | * | 4/1997 | Cook | 379/402 |
|---|---|---|---|---|---|
| 6,226,322 | B1 | * | 5/2001 | Mukherjee | 375/229 |
| 6,281,747 | B2 | * | 8/2001 | Ahuja et al. | 330/109 |
| 6,314,180 | B1 | * | 11/2001 | Bingel | 379/398 |
| 6,542,540 | B1 | * | 4/2003 | Leung et al. | 375/232 |
| 6,566,947 | B2 | * | 5/2003 | Gorcea | 330/75 |
| 6,573,790 | B2 | * | 6/2003 | Steensgaard-Madsen | 330/107 |
| 6,600,366 | B2 | * | 7/2003 | Ferianz | 330/69 |
| 6,681,012 | B1 | * | 1/2004 | Gorcea et al. | 379/402 |
| 6,724,219 | B1 | * | 4/2004 | Kim et al. | 326/30 |
| 6,748,076 | B1 | * | 6/2004 | Elo | 379/402 |
| 6,751,315 | B1 | * | 6/2004 | Liu et al. | 379/413.02 |

OTHER PUBLICATIONS

Zojer et al., "A Broadband High–Voltage SLIC for a Splitter– and Transformer–Less Combined ADSL–Lite/POTS Linecard," IEEE Internatioanl Solid–State Circuits Conference, p. 304–305.

* cited by examiner

Primary Examiner—Binh Tibu
(74) Attorney, Agent, or Firm—Jenkins, Wilson & Taylor, P.A.

(57) ABSTRACT

Broadband driver for signals that are transmitted in different frequency ranges, comprising:
(a) a first broadband driver circuit (19) for driving first signals having signal frequencies that lie in a first frequency range;
(b) a second broadband driver circuit (24) for driving second signals having signal frequencies that lie in a second frequency range;
(c) where at least one of the two broadband driver circuits (19) has a frequency-dependent positive-feedback circuit (44) for impedance synthesis of a frequency-dependent output impedance ($Z_{out}$) of the broadband driver circuit (19), and where the output impedance ($Z_{out}$) has a different value in the first frequency range than in the second frequency range.

14 Claims, 3 Drawing Sheets

BROADBAND DRIVER

TECHNICAL FIELD

The invention concerns a broadband driver for signals that are transmitted in different frequency ranges.

RELATED ART

A broadband high-voltage SLIC (SLIC: subscriber line interface circuit) is known from ZOJER, B., KOBAN, R., Pichler, J.: "A broadband high-voltage SLIC for a Splitter- and Transformer-less Combined ADSL-Lite/POTS Linecard", Feb. 9, 2000, Digest of Technical Papers, ISSCC 2000, P. 304–305. In this report the SLIC circuit comprises a first and a second broadband driver circuit.

In many communication systems, DC voltages or audio frequency signals are transmitted with radio frequency signals over a single signal line. In an xDSL transmission system, both radio frequency data signals and audio frequency speech signals and/or DC voltages are transmitted via the two-wire telephone line. The DC voltages or DC components are used to supply power to the telephone terminal and for generating the ringing and call tones respectively. These transmitted DC voltages often have voltage amplitudes of more than 100 Volts. This means that the associated driver circuit must have a very high supply voltage. In contrast, the radio frequency signal components for data transmission have a much lower voltage amplitude. As a result of the lower load impedance, however, the radio frequency signal components give rise to large supply currents that are drawn from the power supply of the associated driver circuit. This leads to very high power losses in the driver circuit, which prevents integration of the driver circuit for full-rate ADSL systems used in conjunction with analog voice functions. A driver circuit that provides audio frequency signals with high amplitudes as well as radio frequency signals with low amplitudes for transmission over a transmission path, can be provided only with difficulty because of conflicting demands on the technical circuit design, for instance high voltage amplitudes versus high speed.

Thus in communication systems up to now, different driver circuits are provided for the audio frequency signal components and the radio frequency signal components. FIG. 1 shows a driver of the prior art. In the driver shown in FIG. 1, the signal output of a audio frequency high-voltage driver circuit with a high supply voltage of up to 150 Volts is connected in parallel with the signal output of a radio frequency drivable driver circuit with a low supply voltage of 10 to 30 Volts via a signal splitter.

The splitter comprises a low-pass filter and a high-pass filter, where the low-pass filter is connected to the output of the audio frequency high-voltage driver circuit and the high-pass filter HP to the output of the radio frequency broadband driver circuit. The audio frequency high-voltage driver circuit receives the voice signal to be transmitted and the DC voltages for supplying the terminal or for generating the ringing tones. The radio frequency broadband driver circuit receives a radio frequency data signal, for example an xDSL data signal, which is output to the transmission path after being filtered through the high-pass filter HP. The transmission path might for instance be a two-wire telephone line. The audio frequency high-voltage driver circuit is connected via the low-pass filter TP to an output node K, to which the radio frequency broadband driver circuit is also connected via the high-pass filter HP. The low-pass filter TP and the high-pass filter HP are required because the two driver circuits are voltage drivers with a low-impedance signal output. The high-pass filter HP and the low-pass filter TP of the signal splitter thus prevent the signal outputs of the two driver circuits from being short-circuited. The low-pass filter TP and the high-pass filter HP are higher-order filters designed for clear signal separation. The splitter must meet high linearity and quality requirements. The filters in the splitter are composed of passive components. The low-pass filter cannot be designed as an RC filter here, because the power loss in these is too high. The low-pass filter TP is thus formed from inductances L and capacitances C, where the inductances L in particular are not only very complex to implement in the circuit, but also cannot be integrated. Consequently traditional splitters are relatively large and can be manufactured only at high cost.

SUMMARY OF THE INVENTION

It is therefore the object of the present invention to create a broadband driver for signals that are transmitted in different frequency ranges, that is easy to implement as a circuit design.

This object is met according to the invention by a broadband driver with the characteristics cited in claim 1.

The invention creates a broadband driver for signals that are transmitted in different frequency ranges, comprising a first broadband driver circuit for driving first signals having signal frequencies that lie in a first frequency range, a second broadband driver circuit for driving second signals having signal frequencies that lie in a second frequency range, where at least one of the two broadband driver circuits has a frequency-dependent positive-feedback circuit for impedance synthesis of a frequency-dependent output impedance of the broadband driver circuit, and where the output impedance has a different value in the first frequency range than in the second frequency range.

In one preferred embodiment of the broadband driver according to the invention, the first broadband driver circuit is designed to drive audio frequency voice signals, audio frequency ringing signals and DC signals.

In another preferred embodiment, the second broadband driver circuit is designed to drive radio frequency data signals.

The first broadband driver circuit advantageously has a signal preamplifier circuit connected to its input.

In a first embodiment of the broadband driver according to the invention, the positive-feedback circuit feeds a signal output of the first broadband driver circuit to a signal input of the first broadband driver circuit.

In a second alternative embodiment of the broadband driver according to the invention, the positive-feedback circuit feeds the signal output of the first broadband driver circuit to a signal input of the signal preamplifier circuit.

The positive-feedback circuit preferably has a complex impedance.

The positive-feedback circuit preferably contains a capacitor.

The complex impedance of the positive-feedback circuit preferably decreases as the frequency of the feedback signal increases.

In one particularly advantageous embodiment of the broadband driver according to the invention, the broadband driver circuits are fully differential.

The signal outputs of the two broadband driver circuits are preferably connected in parallel and are connected to a transmission channel via a signal output of the broadband driver according to the invention.

The transmission channel is preferably a two-wire telephone line.

The signal output of the second broadband driver circuit is preferably followed by a transformer circuit.

The radio frequency data signal driven by the second broadband driver circuit is preferably an xDSL data signal, in particular an ADSL data signal.

BRIEF DESCRIPTION OF THE DRAWINGS

Preferred embodiments of the broadband driver according to the invention are described below with reference to the attached figures to explain the essential features of the invention.

DETAILED DESCRIPTION OF THE INVENTION

Figure 1:
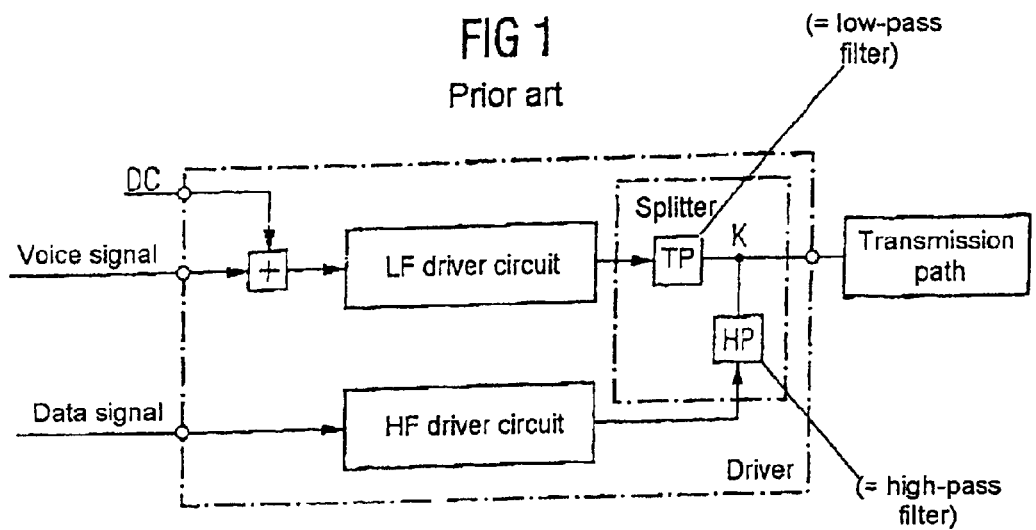
FIG. 1 shows a driver according to the prior art.
Figure 2:
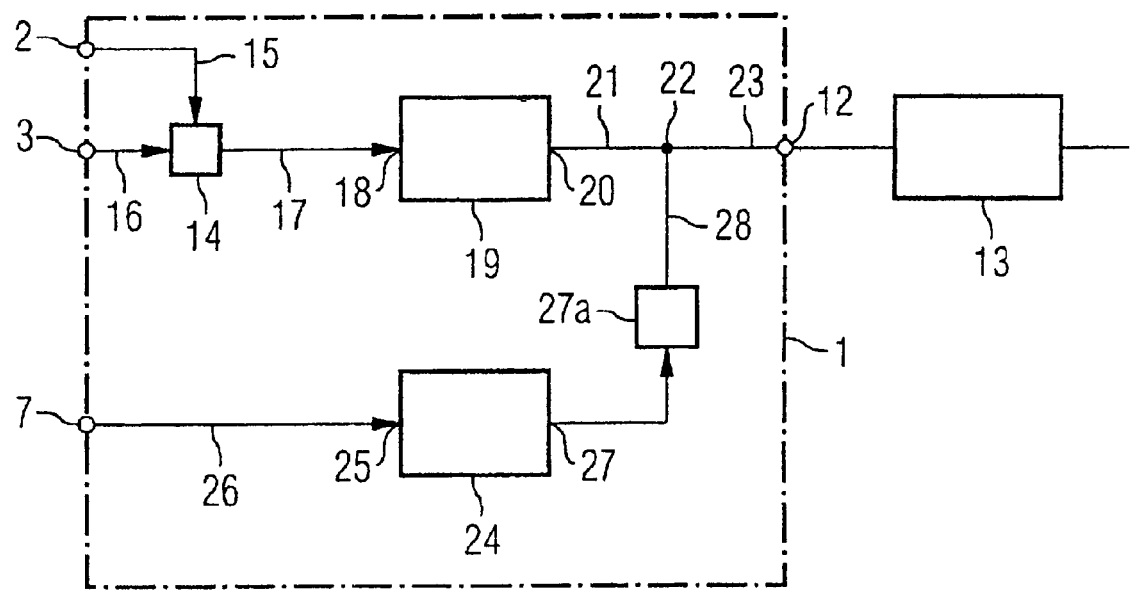
FIG. 2 shows a block diagram of a broadband driver according to the invention.

As can be seen from FIG. 2, the broadband driver 1 according to the invention has a first signal input 2 for receiving DC signal components and ringing signals and a second signal input 3 for receiving audio frequency voice signals.

The broadband driver 1 according to the invention has another signal input 7 for receiving a radio frequency data signal, in particular an xDSL data signal.

The broadband driver 1 according to the invention has a signal output 12 that is connected to a transmission channel 13, for example a two-wire telephone line.

The broadband driver 1 contains a summation circuit 14 that is connected to the two first signal inputs 2, 3 via lines 15, 16, and which takes the DC components and audio frequency ringing tones that are applied to the first input signal 2, and the audio frequency voice signals that are applied to the second signal input 3, then outputs these summed and superimposed signals via a line 17 to a signal input 18 of a first broadband driver circuit 19 inside the broadband driver 1 according to the invention. The first broadband driver circuit 19 is used for driving the audio frequency signals whose signal frequencies lie in a first low frequency range. The first broadband driver circuit 19 has a signal output 20 that is connected via a line 21 to a node 22. The signal node 22 is connected via an internal line 23 to the signal output 12 of the broadband driver 1 according to the invention.

The broadband driver 1 also contains a second broadband driver circuit 24, whose signal input 25 is connected via a line 26 to the third signal input 7 of the broadband driver 1 for receiving the radio frequency data signals. The second broadband driver circuit 24 also has a signal output 27 that is connected via a high-pass filter 27a and a line 28 to the node 22. The two signal outputs 20 and 27 of the first and second broadband driver circuit 19, 24 are connected in parallel to the transmission path.

The first broadband driver circuit 19 is used for driving the audio frequency voice signals, the DC components and the audio frequency ringing tones, whose signal frequencies lie in a first low frequency range. The second broadband driver circuit 24, connected in parallel, is designed to drive radio frequency data signals whose signal frequencies lie in a second higher frequency range. Here at least one of the two broadband driver circuits 19, 24 has a frequency-dependent positive-feedback circuit for impedance synthesis of a frequency-dependent output impedance of the broadband driver circuit. The frequency-dependent output impedance generated by the positive-feedback circuit of one of the two broadband driver circuits 19, 24 then has a different value in the first frequency range than in the second frequency range.

Figure 3:
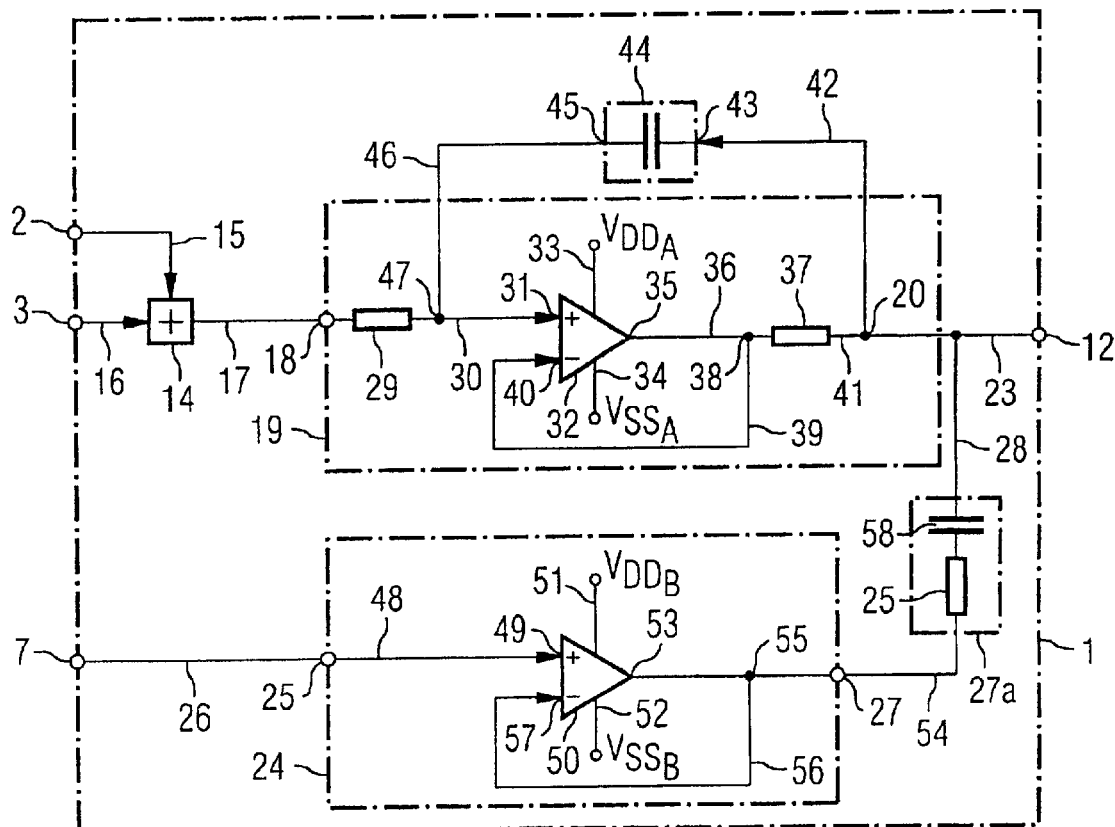
FIG. 3 shows a circuit diagram of a first embodiment of the broadband driver according to the invention.

FIG. 3 shows a preferred embodiment of the broadband driver according to the invention, in which the first broadband driver circuit 19 has a frequency-dependent output impedance that is low in a low frequency range and high in a high frequency range.

The first broadband driver circuit 19 contains an input resistor 29 that is connected to signal input 18. The input resistor 29 is connected via a line 30 to a non-inverting input 31 of an operational amplifier 32. The operational amplifier 32 is supplied via power supply connections 33, 34 with a supply voltage $V_{DDa}$, $V_{SSa}$. In order to drive the radio frequency DC components, the supply voltage for the operational amplifier 32 is more than 140 Volts. The operational amplifier 32 has a signal output 35 that is connected via a line 36 to an output resistor 37 of the first broadband driver circuit 19. The signal output 35 of the operational amplifier 32 is connected at a branch node 38 via a negative-feedback line 39 to an inverting signal input 40 of the operational amplifier 32. The output resistor 37 is connected via a line 41 to the signal output 20 of the first broadband driver circuit 19. In addition, the signal output 20 is connected via a positive-feedback line 42 to a signal input 43 of a positive-feedback circuit 44. The positive-feedback circuit 44 has a signal output 45 that is connected via a line 46 to the line 30 at a node 47. The effect of the positive-feedback circuit 44 is to synthesize the output impedance of the first broadband driver circuit 19. As a result of the impedance synthesis, the first broadband driver circuit exhibits a frequency-dependent output impedance. In the embodiment illustrated in FIG. 3, the positive-feedback circuit 44 feeds the signal output 20 of the first broadband driver circuit 19 back to the signal input of the first broadband driver circuit 19. The positive-feedback circuit 44 has a complex impedance. In the embodiment illustrated in FIG. 3, the positive-feedback circuit 44 comprises a capacitor with a complex impedance that decreases as the signal frequency increases.

The output impedance of the signal output 20 of the first broadband driver circuit 19 equals:

$$Z_{out} = R_{37} \frac{1 + j2\pi f C_{44} \cdot R_{29}}{1 + j2\pi f C_{44} \cdot R_{37}} \quad (1)$$

where $C_{44}$ is the capacitance of the positive-feedback capacitor 44, $R_{29}$ is the resistance of the input resistor 29, and $R_{37}$ is the resistance of the output resistor 37.

Figure 4:
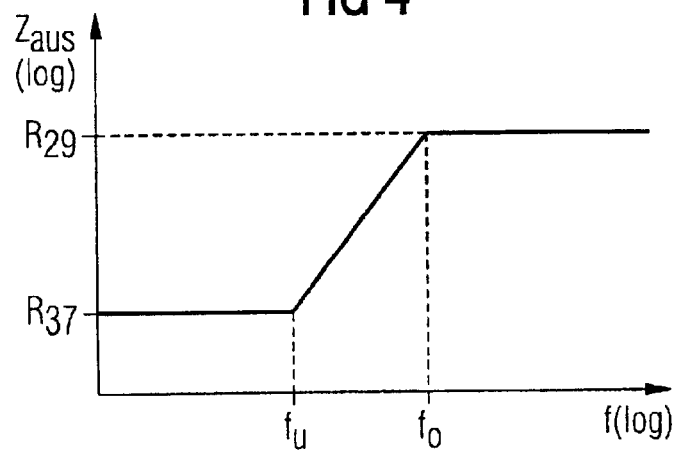
FIG. 4 shows an output impedance curve for the first broadband driver circuit for driving audio frequency signals in the first embodiment of the broadband driver according to the invention illustrated in FIG. 3.

FIG. 4 shows the frequency response of the output impedance $Z_{out}$ of the first broadband driver circuit 19 in the broadband driver 1 according to the invention shown in FIG. 3. The output impedance $Z_{out}$ and frequency f are shown logarithmically in the figure. Up to a lower cut-off frequency $f_U$ of the output impedance, $Z_{out}$ essentially indicates the value of the output resistor $R_{37}$. Between the lower cut-off frequency $f_U$ and an upper cut-off frequency $f_O$, the output impedance $Z_{out}$ increases sharply, and, above the upper cut-off frequency $f_O$, has a resistance value that is essentially equal to the resistance of the input resistor 29.

The upper and lower cut-off frequencies are given by:

$$f_U = \frac{1}{2\pi C_{44} \cdot R_{29}} \quad (2)$$

$$f_o = \frac{1}{2\pi C_{44} \cdot R_{37}} \quad (3)$$

In xDSL applications of the broadband driver 1 according to the invention, the lower cut-off frequency $f_U$ is about 14 kHz and the upper cut-off frequency $f_O$ about 138 kHz. The input resistance of the resistor 29 typically lies in the range 5 kΩ to 10 kΩ, while the resistance of the output resistor 37 is about 200 Ω. The capacitance of the positive-feedback capacitor 44 is in the nanofarad range. The high output impedance $Z_{out}$ in the high frequency range prevents a short circuit with the signal output of the second broadband driver circuit 24, which has a low impedance in this frequency range.

As can be seen from FIG. 3, the broadband driver according to the invention in the preferred embodiment shown there contains a second broadband driver circuit 24 for the radio frequency xDSL data signals. The signal input 25 of the second broadband driver circuit 24 is connected via a line 48 to the non-inverting signal input 49 of an operational amplifier 50. The operational amplifier 50 is supplied via power supply connections 51, 52 with a supply voltage $V_{DDb}$, $V_{SSb}$. The supply voltage here is preferably in a range of 10 to 30 Volts. The operational amplifier 50 has a signal output 53 that is connected to an output resistor 25a via a signal line 54. From a branch node 55, the signal output 53 of the operational amplifier 50 is connected via a feedback line 56 to an inverting signal input 57 of the operational amplifier 50. The second broadband driver circuit 24 also contains a capacitor 58, that is connected to the signal output 27 of the broadband driver circuit 24 via an output resistor 25a. The capacitor 58 acts as an analog high-pass filter for the radio frequency data signals.

The two operational amplifiers 32, 50 of the two broadband driver circuits 19, 24 both have a broadband design. The operational amplifier 50 requires a signal bandwidth of about 1.1 MHz for example to drive ADSL data signals. For the impedance synthesis, the operational amplifier 32 of the first broadband driver circuit also has a similarly high signal bandwidth of about 1.1 MHz. In addition, the two operational amplifiers 32, 50 preferably have a linearity greater than 65 dB.

Figure 5:
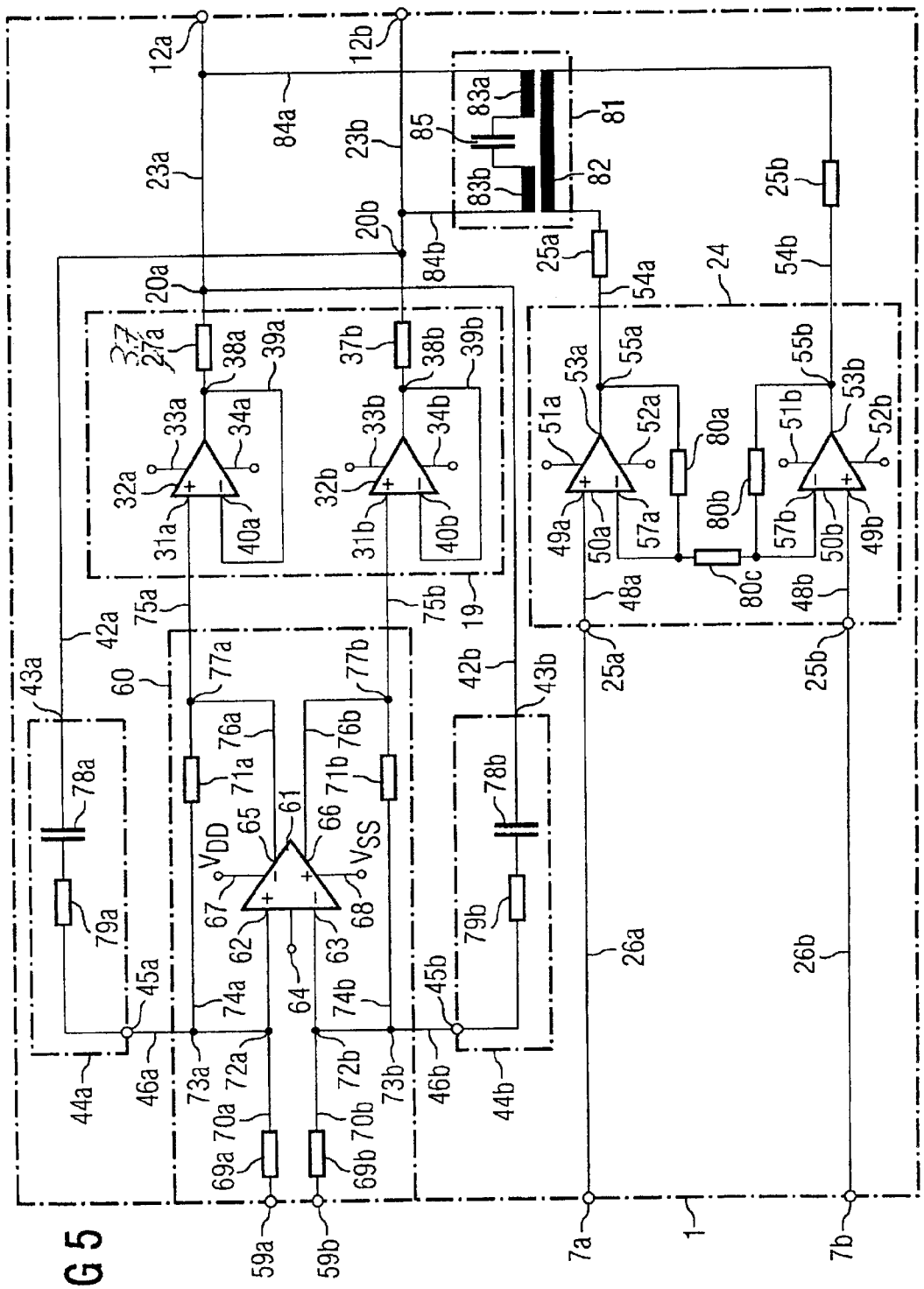
FIG. 5 shows a particularly advantageous embodiment of the broadband driver according to the invention designed with fully-differential circuit components.

FIG. 5 shows a particularly advantageous embodiment of the broadband driver 1 according to the invention. In the embodiment shown in FIG. 5, the major circuit components have a fully differential design. Furthermore, the positive-feedback circuits 44a, 44b feed back the signal outputs 20a, 20b of the first broadband driver circuit to a signal node 72a, 72b of a signal preamplifier circuit 60. The audio frequency voice signals, the audio frequency ringing signals and the DC signals are applied to the signal input 59 of the signal preamplifier circuit 60. The signal preamplifier circuit 60 contains an operational amplifier 61 in a fully differential design with a non-inverting signal input 62, an inverting signal input 63, a common-mode signal input 64, an inverting signal output 65 and a non-inverting signal output 66. In addition, the fully differential operational amplifier 61 is supplied with a supply voltage $V_{DD}$, $V_{SS}$ via power supply connections 67, 68. The applied common-mode voltage preferably equals $(V_{DD}+V_{SS})/2$. The signal inputs 59a, 59b of the signal preamplifier circuit 60 have input resistors 69a, 69b which are connected via lines 70a, 70b to the inputs 62, 63 of the operational amplifier 61. The signal preamplifier circuit 60 also contains negative-feedback resistors 71a, 71b. The output 45a, 45b of the positive-feedback circuits 44a, 44b is connected to lines 70a, 70b via lines 46a, 46b and via signal nodes 72a, 72b. At signal nodes 73a, 73b, the negative-feedback resistors 71a, 71b are connected to signal nodes 73a, 73b via lines 74a, 74b. The negative-feedback resistors 71a, 71b are also connected via lines 75a, 75b to the non-inverting signal inputs 31a, 31b of the operational amplifiers 32a, 32b of the first broadband driver circuit 19. The inverting signal output 65 of the fully differential operational amplifier 61 is connected via a line 76a and a node 77a to the connecting line 75a. The non-inverting signal output 66 of the operational amplifier 61 is connected via a line 76b and a node 77b to the connecting line 75b.

The signal gain of the signal preamplifier circuit 60 is set by resistors 69, 71, where the signal gain V is:

$$V = \frac{R_{71}}{R_{69}} \quad (4)$$

provided $f \leq f_U$.

The positive-feedback circuits 44a and 44b in the embodiment shown in FIG. 5 each comprise a capacitor 78 and a resistor 79 connected in series.

The following equation gives the output resistance of the first broadband driver circuit 19 between signal outputs 20a, 20b:

$$Z_{out} = Z_{outa} + Z_{outb} = \quad (5)$$
$$(R_{37a} + R_{37b}) \cdot \frac{1 + j2\pi f C_{78a} \cdot R_{79a}}{1 + j2\pi f C_{78a}(R_{37a} + R_{37b} + R_{79a} - R_{71a})}$$

As a result of the positive feedback of the signal output of the first broadband driver circuit 19 to the signal input of the signal preamplifier circuit 60, as shown in FIG. 5, asymmetries between the components, which for instance might arise from the manufacturing process, can be tolerated far better than for feedback of the signal output 20 of the first broadband driver circuit 19 to the signal input 31a, 31b of the broadband driver circuit 19. Due to the common-mode rejection at the input of the operational amplifier 61, the effects of any asymmetry are reduced by the value of the input common-mode rejection.

The second broadband driver circuit 24 for the radio frequency data signals has a fully differential design in the embodiment shown in FIG. 5, where the signal outputs 53a, 53b of the operational amplifiers 50a, 50b are each connected via feedback resistors 80a, 80b to the inverting signal inputs 57a, 57b. In addition, the inverting signal inputs 57a, 57b and the operational amplifiers 50a, 50b are connected together by a resistor 80c.

On the output side, the second broadband driver circuit 24 is connected to the signal output 12a, 12b of the broadband driver circuit 1 via a transformer circuit 81. The transformer circuit 81 comprises a primary coil 82, whose inputs are connected to the resistors 25a, 25b, and two secondary coils 83a, 83b, which are connected to the signal output 12a, 12b via lines 84*a*, 84*b*, and connected together by capacitor 85. The transformer circuit 81 has a turns ratio n. The supply voltage for the second broadband driver circuit 24 can be reduced by making suitable adjustments to the turns ratio n, by which means the second broadband driver circuit 24 can be constructed in a faster design technology. The resistors 37*a*, 37*b* and the resistors 25*a*, 25*b* are used for transmission path matching and line matching respectively.

Instead of the transformer circuit 81, a capacitor 58 can be connected downstream from each of the resistors 25*a*, 25*b* as shown in FIG. 3.

In the embodiment shown in FIG. 5, all components are designed to be symmetric, i.e. they meet the following condition:

$$R_{ia} = R_{ib}$$

$$C_{ia} = C_{ib} \qquad (6)$$

As can be seen from FIGS. 3 and 4, the broadband driver 1 according to the invention does not contain any inductances, so that, apart from capacitors 44, 78*a*, 78*b*, the design is easy to integrate from a circuit technology viewpoint. The capacitors 44, 78*a*, 78*b* have a very high dielectric strength of over 100 Volts.

In further embodiments, the output resistance of the second broadband driver circuit can be generated from impedance synthesis by means of feedback.

The broadband driver 1 according to the invention is particularly suitable for the use of audio frequency voice signals and radio frequency xDSL data signals.

What is claimed is:

1. A broadband driver for signals that are transmitted in different frequency ranges, via a transmission channel, comprising:
   (a) a first broadband driver circuit for driving first transmission signals having signal frequencies that lie in a first frequency range;
   (b) a second broadband driver circuit for driving second transmission signals having signal frequencies that lie in a second frequency range;
   (c) wherein the first broadband driver circuit and the second broadband driver circuit have a signal output, and wherein the signal outputs of both broadband drivers are connected in parallel to said transmission channel; and
   (d) wherein at least one of the two broadband driver circuits has a frequency-dependent positive-feedback circuit for impedance synthesis of a frequency-dependent output impedance of the broadband driver circuit, and wherein the output impedance has a first resistance value in the first frequency range and a second resistance value in the second frequency range.

2. The broadband driver as claimed in claim 1, wherein the first broadband driver circuit is designed to drive audio frequency voice signals, audio frequency ringing signals and DC signals.

3. The broadband driver as claimed in claim 1, wherein the second broadband driver circuit is designed to drive radio frequency data signals.

4. The broadband driver circuit as claimed in claim 1, wherein the first broadband driver circuit has a signal preamplifier circuit connected to its input.

5. The broadband driver as claimed in claim 1, wherein the positive-feedback circuit feeds a signal output of the first broadband driver circuit to a signal input of the first broadband driver circuit.

6. The broadband driver as claimed in claim 5, wherein the positive-feedback circuit feeds the signal output of the first broadband driver circuit to a signal input of the signal preamplifier circuit.

7. The broadband driver as claimed in claim 1, wherein the positive feedback circuit has a complex impedance.

8. The broadband driver as claimed in claim 1, wherein the positive-feedback circuit contains a capacitor.

9. The broadband driver as claimed in claim 7, wherein the complex impedance of the positive-feedback circuit decreases as the signal frequency increases.

10. The broadband driver as claimed in claim 1, wherein the broadband driver circuit have a fully differential design.

11. The broadband driver as claimed in claim 4, wherein the signal preamplifier circuit has a fully differential design.

12. The broadband driver as claimed in claim 1, wherein the transmission channel is a two-wire telephone line.

13. The broadband driver as claimed in claim 1, wherein the signal output of the second broadband driver circuit is connected to a transformer circuit.

14. The broadband driver as claimed in claim 3, wherein the radio frequency data signal is an xDSL signal.

* * * * *